(12) United States Patent
Bayramian

(10) Patent No.: US 8,547,632 B2
(45) Date of Patent: Oct. 1, 2013

(54) METHOD AND SYSTEM FOR HOMOGENIZING DIODE LASER PUMP ARRAYS

(75) Inventor: Andy J. Bayramian, Manteca, CA (US)

(73) Assignee: Lawrence Livermore National Security, LLC, Livermore, CA (US)

(*) Notice: Subject to any disclaimer, the term of this patent is extended or adjusted under 35 U.S.C. 154(b) by 940 days.

(21) Appl. No.: 12/544,147

(22) Filed: Aug. 19, 2009

(65) Prior Publication Data

US 2011/0043900 A1 Feb. 24, 2011

(51) Int. Cl.
*H01S 3/00* (2006.01)

(52) U.S. Cl.
USPC ............................................. 359/345

(58) Field of Classification Search
USPC ................................. 372/38.06, 75; 359/345
See application file for complete search history.

(56) References Cited

U.S. PATENT DOCUMENTS

| | | | |
|---|---|---|---|
| 4,547,037 A | 10/1985 | Case | |
| 5,307,365 A | 4/1994 | Stappaerts et al. | |
| 5,610,733 A | 3/1997 | Feldman et al. | |
| 5,787,107 A | 7/1998 | Leger et al. | |
| 5,796,521 A | 8/1998 | Kahlert et al. | |
| 6,215,598 B1* | 4/2001 | Hwu | 359/641 |
| 6,700,709 B1 | 3/2004 | Fermann | |
| 6,738,407 B2 | 5/2004 | Hirano et al. | |
| 7,551,818 B2 | 6/2009 | Okorogu | |
| 2006/0045144 A1 | 3/2006 | Karlsen et al. | |
| 2006/0114961 A1* | 6/2006 | Manni | 372/70 |
| 2007/0223093 A1 | 9/2007 | Ushiro et al. | |
| 2007/0273957 A1 | 11/2007 | Zalevsky et al. | |

FOREIGN PATENT DOCUMENTS

| | | |
|---|---|---|
| JP | 2007-121941 A | 5/2007 |
| JP | 2008-170471 A | 7/2008 |
| WO | WO 99/39410 A1 | 8/1999 |
| WO | WO 00/21165 A1 | 4/2000 |
| WO | WO 2005/036211 A2 | 4/2005 |

OTHER PUBLICATIONS

Kopp et al., "Efficient beamshaper homogenizer design combining diffractive optical elements, microlens array and random phase plate," J. Opt. A: Pure Appl. Opt. 1999; 1:398-403.

(Continued)

*Primary Examiner* — Mark Hellner
(74) *Attorney, Agent, or Firm* — Kilpatrick Townsend & Stockton LLP

(57) ABSTRACT

An optical amplifier system includes a diode pump array including a plurality of semiconductor diode laser bars disposed in an array configuration and characterized by a periodic distance between adjacent semiconductor diode laser bars. The periodic distance is measured in a first direction perpendicular to each of the plurality of semiconductor diode laser bars. The diode pump array provides a pump output propagating along an optical path and characterized by a first intensity profile measured as a function of the first direction and having a variation greater than 10%. The optical amplifier system also includes a diffractive optic disposed along the optical path. The diffractive optic includes a photo-thermorefractive glass member. The optical amplifier system further includes an amplifier slab having an input face and position along the optical path and separated from the diffractive optic by a predetermined distance. A second intensity profile measured at the input face of the amplifier slab as a function of the first direction has a variation less than 10%.

12 Claims, 7 Drawing Sheets

(56) References Cited

OTHER PUBLICATIONS

Overton, "Laser Beam Shaping: Diode-laser system yields 11kW homogenized output," Laser Focus World, May 2007; copy can be retrieved from the Internet: <<http://www.dilas.com/gdresources/downloads/mediacoverage/DILAS_LaserBeam_Shaping_LFW_0520071.pdf>>.

Rudnaya et al., "Rational design of a diffractive homogenizer for a laser beam" J Engineering Mathematics, 2002; 43:189-199.

Schwartz, *Encyclopedia of Smart Materials: vol. 2*, 2002 John Wiley & Sons, pp. 770-780.

Suss MicroOptics SA Catalog 2007: MicroLens Arrays, Feb. 2007, 16 pages total.

U.S. Appl. No. 12/544,161, filed Aug. 19, 2009; First named inventor: Andrew James.

Extended European Search Report of European Patent Application No. 10008684, mailed Dec. 27, 2010, 7 pages total.

Efimov et al., "Diffractive optical elements in photosensitive inorganic glasses," SPIEL Proc., 2001; 4452:39-47.

Kukhtarev et al., "Laser Beam Shaping by Holographic Optical Elements," SPIEL Proc., 2003; 5257:152-162.

Partial European Search Report of Patent Application No. 10008683.4, mailed Dec. 27, 2010, 7 pages total.

* cited by examiner

METHOD AND SYSTEM FOR HOMOGENIZING DIODE LASER PUMP ARRAYS

STATEMENT AS TO RIGHTS TO INVENTIONS MADE UNDER FEDERALLY SPONSORED RESEARCH OR DEVELOPMENT

The United States Government has rights in this invention pursuant to Contract No. DE-AC52-07NA27344 between the U.S. Department of Energy and Lawrence Livermore National Security, LLC, for the operation of Lawrence Livermore National Laboratory.

CROSS-REFERENCES TO RELATED APPLICATIONS

The following two regular U.S. patent applications (including this one) are being were filed concurrently, and the entire disclosure of U.S. patent application Ser. No. 12/544,161, is incorporated by reference into this application for all purposes:
- application Ser. No. 12/554,147, filed Aug. 19, 2009, entitled "Method and System for Homogenizing Diode Laser Pump Arrays"; and
- application Ser. No. 12/554,161, filed Aug. 19, 2009, entitled "Diffractive Laser Beam Homogenizer including a Photo-Active Material and Method of Fabricating the Same".

BACKGROUND OF THE INVENTION

In high average power diode pumped solid state lasers, large diode laser pump arrays are commonly used to pump large aperture amplifiers. Developments in diode laser pumps have resulted in high output powers suitable for pumping high power solid state lasers. As a result, diode laser pumps have replaced flash lamp pumps in many applications.

FIG. 1 is a simplified perspective illustration of a two-dimensional array of diode lasers (i.e., semiconductor lasers). The diode laser array 100 includes a number of diode laser bars 110 stacked together with heat exchangers 120 on a base 130. The heat exchangers 120 may be actively cooled microchannel heat exchangers or the like. Heat conductors 140a and 140b may be utilized to provide an additional thermal path for removal of heat generated by the laser diode bars 110. Each individual laser bar includes a horizontally disposed array of lasers 112, each emitting pump radiation. Thus, the diode laser array 100 includes M×N lasers, where M is the number of diode laser bars 110 and N is the number of lasers 112 per bar.

Although diode pumping offers dramatically increased efficiency, longevity, and decreased heat loading relative to flash lamp pumping, diode laser pump arrays typically provide anisotropic (uneven) illumination. As illustrated in FIG. 2, because of the generally oval shape of the beam at the laser facet, the divergence of an output beam from a diode laser is anisotropic, with the divergence angle in the vertical plane ($\theta_V$) being significantly greater than the divergence angle in the horizontal direction ($\theta_H$). Lenslet arrays mounted in front of the diode laser bars, with a horizontally disposed lenslet array matched to each horizontal laser bar, have been used to decrease the divergence angle in the vertical plane to a value approximately equal to the divergence angle in the horizontal direction.

Despite the matching of divergence angles using lenslet arrays, there is a need in the art for improved methods and systems for homogenizing the beams of diode laser pump arrays.

SUMMARY OF THE INVENTION

The present invention relates generally to laser systems. More particularly, the present invention relates to a method and system for homogenizing the output from a diode laser array. Merely by way of example, the method and apparatus have been applied to a diffractive photo-thermo-reflective glass member optically coupled to a diode laser array to provide an output with a substantially uniform intensity profile. Additionally, methods of fabricating large diffractive homogenizers are provided by embodiments of the present invention. It will be recognized that the invention has a much broader range of applicability and can be applied to other laser systems.

According to an embodiment of the present invention, an optical amplifier system is provided. The optical amplifier system includes a diode pump array including a plurality of semiconductor diode laser bars disposed in an array configuration and characterized by a periodic distance between adjacent semiconductor diode laser bars. The periodic distance is measured in a first direction perpendicular to each of the plurality of semiconductor diode laser bars. The diode pump array provides a pump output propagating along an optical path and characterized by a first intensity profile measured as a function of the first direction and having a variation greater than 10%. The optical amplifier system also includes a diffractive optic disposed along the optical path. The diffractive optic includes a photo-thermo-refractive glass member. The optical amplifier system further includes an amplifier slab having an input face and position along the optical path and separated from the diffractive optic by a predetermined distance. A second intensity profile measured at the input face of the amplifier slab as a function of the first direction has a variation less than 10%.

According to another embodiment of the present invention, a method of fabricating a diffractive homogenizer is provided. The method includes providing a partially transmissive optical element having a predetermined grayscale intensity pattern thereon, providing a transparent optical element, and directing UV radiation through the partially transmissive optical element to impinge on the transparent optical element. The method also includes exposing a predetermined portion of the transparent optical element to the UV radiation and thermally treating the transparent optical element to produce the diffractive homogenizer characterized by a continuously varying index of refraction profile as a function of position within the transparent optical element.

Many benefits are achieved by way of the present invention over conventional techniques. For example, the present technique provides for homogenization of diode illumination, resulting in a uniform intensity profile, higher extraction efficiency from solid state amplifiers and laser gain media, and improved beam quality for the output of the solid state amplifiers. Moreover, transfer efficiency provided by embodiments of the present invention can exceed 98%. Embodiments of the present invention are applicable to high power solid state amplifiers as well as solid state lasers. Additionally, embodiments of the present invention provide a method of manufacturing diffractive optics with smooth phase profiles, thereby improving homogenization and solid state amplifier/laser efficiency. Embodiments of the present invention homogenize the diode illumination, leading to even illumination and improved beam quality in high average power diode pumped solid state lasers. Even illumination enables improved laser extraction efficiency and a uniform thermal load which minimizes thermally induced wavefront distortions. The improved beam quality and wavefront further serve to enhance the reliability of the laser device since the fluence or intensity loading of optics in the system are lower relative to the laser induced optical damage threshold. These and other embodiments of the invention along with many of its advantages and features are described in more detail in conjunction with the text below and attached figures.

DETAILED DESCRIPTION OF SPECIFIC EMBODIMENTS

Figure 1:
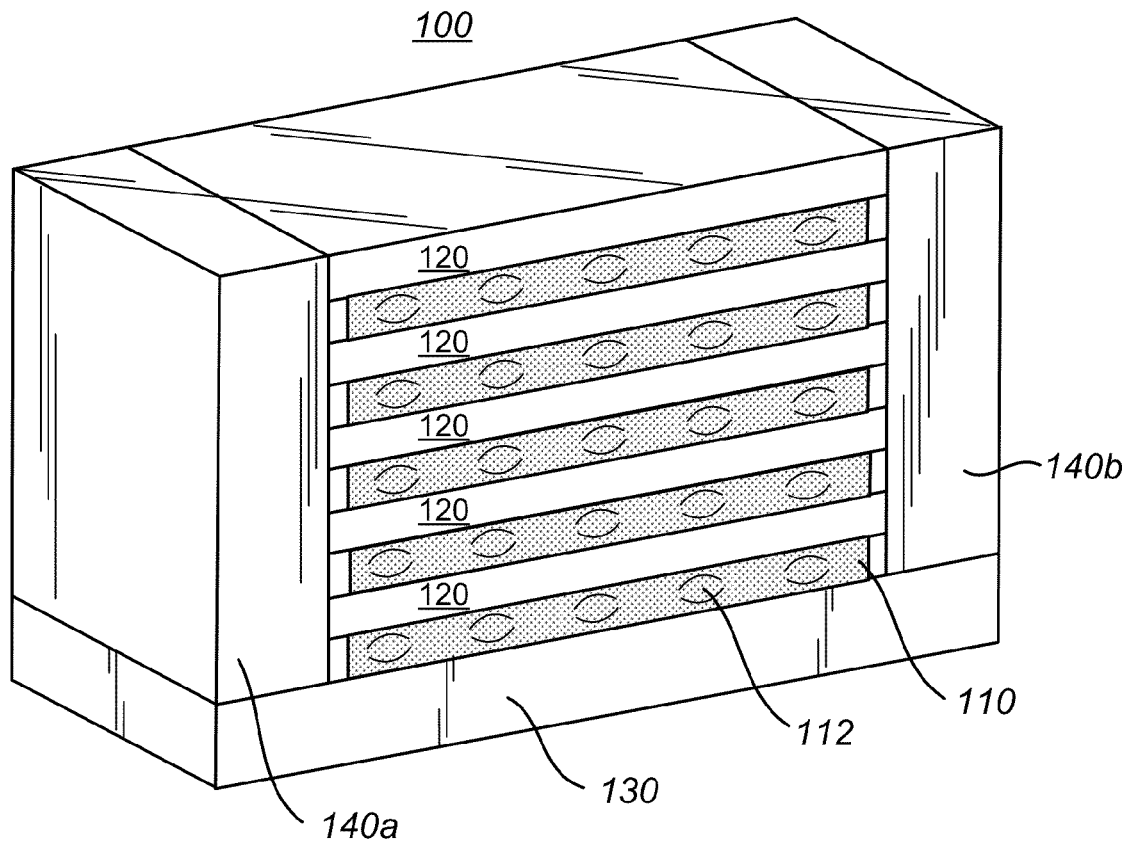
FIG. 1 is a simplified perspective illustration of a two-dimensional array of diode lasers.
Figure 2:
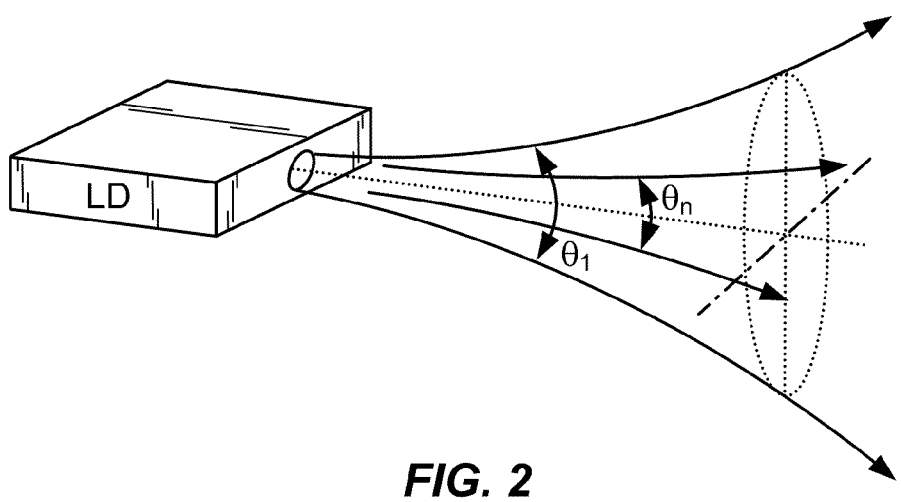
FIG. 2 is a simplified perspective illustration of divergence angles for a diode laser.
Figure 3:
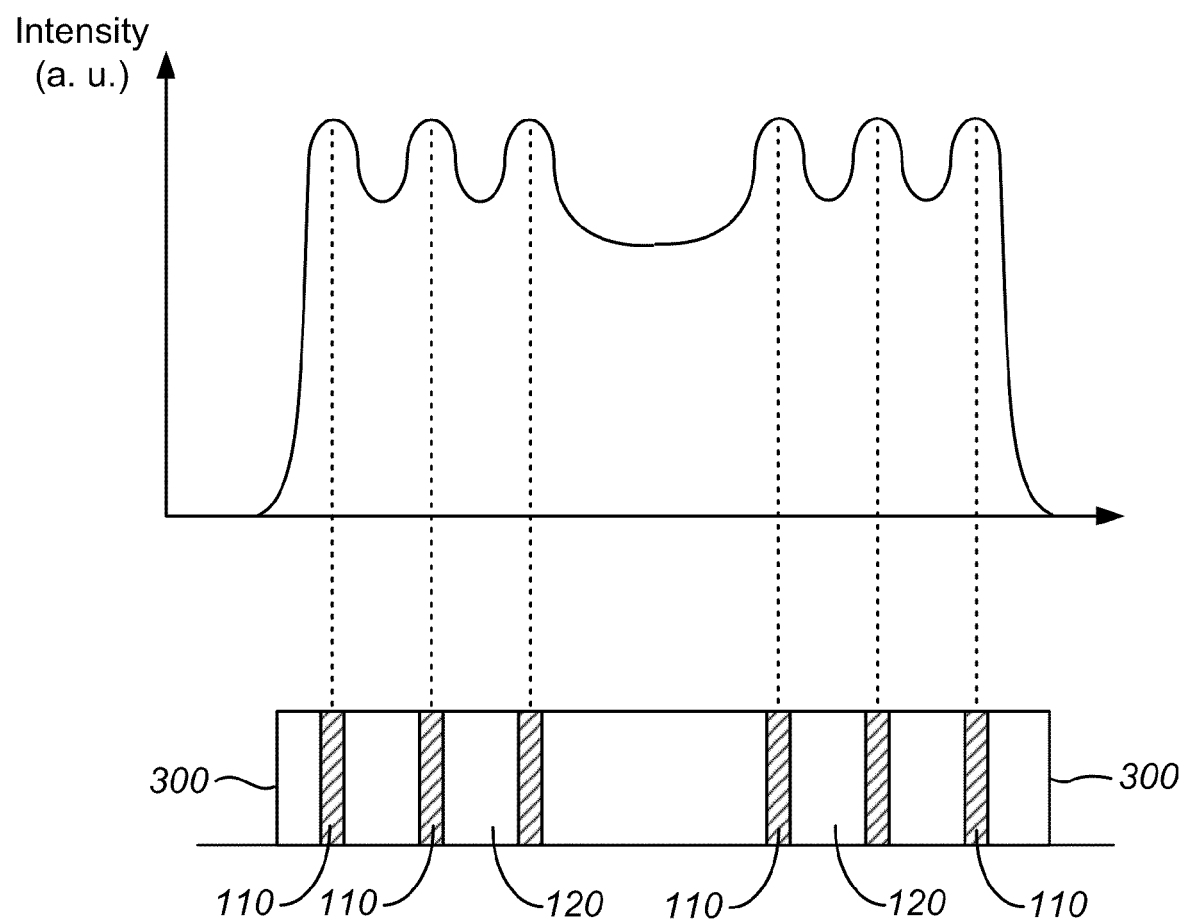
FIG. 3 is a simplified plot of laser intensity as a function of position for two modules of diode laser arrays.

FIG. 3 is a simplified plot of laser intensity as a function of position for two modules of diode laser arrays. For FIG. 3, two modules 300 are illustrated, each module including an array of laser bars 110 separated by heat spreaders 120. The modules can be similar to the diode laser pump array 100 illustrated in FIG. 1. Even if the modules are collimated using lenslet arrays, the intensity profile measured vertically down the module 300 will be non-uniform. As shown in FIG. 3, the intensity profile has peaks associated with the laser bars 110, valleys associated with the heat spreaders 120 between the laser bars, and a larger valley between adjacent modules. The intensity profile illustrated in FIG. 3 is undesirable since such a pump intensity profile will result in non-uniformity in the gain profile of the amplifier. Non-uniformity in the gain profile of the amplifier (or laser) results in lower amplifier efficiency and degraded beam quality.

To overcome the non-uniformity problem illustrated in FIG. 3, various methods have been attempted. As an example, diode laser pump light from each emitter or from a group of emitters can be launched into an optical fiber. Although using an optical fiber to homogenize light from an emitter or group of emitters can improve the beam homogeneity, individual optical fibers are limited in power and employing this method is expensive and inefficient. Another approach has been transverse pumping of the amplifier slab so that the diode pumping of the slab is orthogonal to the direction of laser propagation. Although transverse pumping provides some benefits in improving the gain uniformity for small rods (e.g., rod diameter less than 1 cm) and small slab lasers and amplifiers, scaling this method to larger apertures is difficult and prone to producing non-uniform gain across the aperture. Yet another approach is to use hollow reflective (or solid refractive) ducting to mix beams from multiple emitters. Although this technique provides some benefits, it is less efficient and more expensive than the techniques provided by embodiments of the present invention.

The ability of glass to change coloration after exposure to sunshine has been known in the art. More recently, photosensitive glass has been used to record a permanent image in silicate glass. A two-step process of exposure to UV radiation followed by thermal development resulted in a crystalline phase precipitation in the exposed areas, similar to a photographic process. A variety of different photosensitive glasses have been developed and been used in various applications, for example, photochromic eye glasses.

Another type of photosensitive glass, which is utilized in embodiments of the present invention, is photo-thermo-refractive (PTR) glass. If PTR glass is exposed to UV radiation and then processed by heat treatment, the index of refraction of the PTR glass will change in response to the UV radiation/heat treatment process. Without limiting the scope of embodiments of the present invention, it is believed that the photorefractive effect is based on a redox reaction of silver initiated during the UV exposure process (i.e., silver ions are converted to nanoclusters of silver metal). The elemental silver particles serve as nucleation centers for the growth of a second phase during the thermal development process, typically performed for several hours at a temperature of about 500° C. This second phase is believed to be sodium and potassium halogenide rich, resulting in a lower index of refraction in exposed areas in comparison with unexposed areas. By controlling the UV intensity pattern during exposure, the refractive index change can also be controlled. Using this process, planar slabs of PTR glass (i.e., rectangular parallelepipeds) are used as diffractive homogenizers according to embodiments of the present invention. For example, to fabricate a volume Bragg grating, an interference pattern using two plane-wave-UV laser beams is created inside the PTR glass in order to induce a sinusoidal refractive index variation.

Photorefractive glasses, such as PTR glasses, have been used as a photosensitive medium to fabricate high-efficiency phase volume holograms used in communications systems, for example, wavelength division multiplexing (WDM) systems. In these applications, a linear refractive index modulation is achieved in the PTR glass after exposure to UV radiation followed by thermal treatment. Typically, PTR glass is a silicate glass, based on $SiO_2$ and various additives. Exemplary grating-based diffractive elements include volume Bragg gratings (VBG) for angular beam combining, spectral beam combining, and mode locking Exemplary VGB-based devices are available from OptiGrate Corp. of Orlando, Fla. and PD-LD Inc. of Pennington, N.J.

The conventional volume Bragg gratings are either periodic or chirped depending on the particular application and are fabricated by exposure using lasers as is typical with grating structures. Embodiments of the present invention contrast with these conventional grating structures formed in PTR since the pattern is not periodic or chirped, but defined based on the particular intensity profile present at the input face of the diffractive homogenizer and the desired intensity profile at the optical gain medium. The diffractive homogenizers provided by embodiments of the present invention are non-sinusoidal in contrast with grating based volume Bragg gratings.

Figure 4:
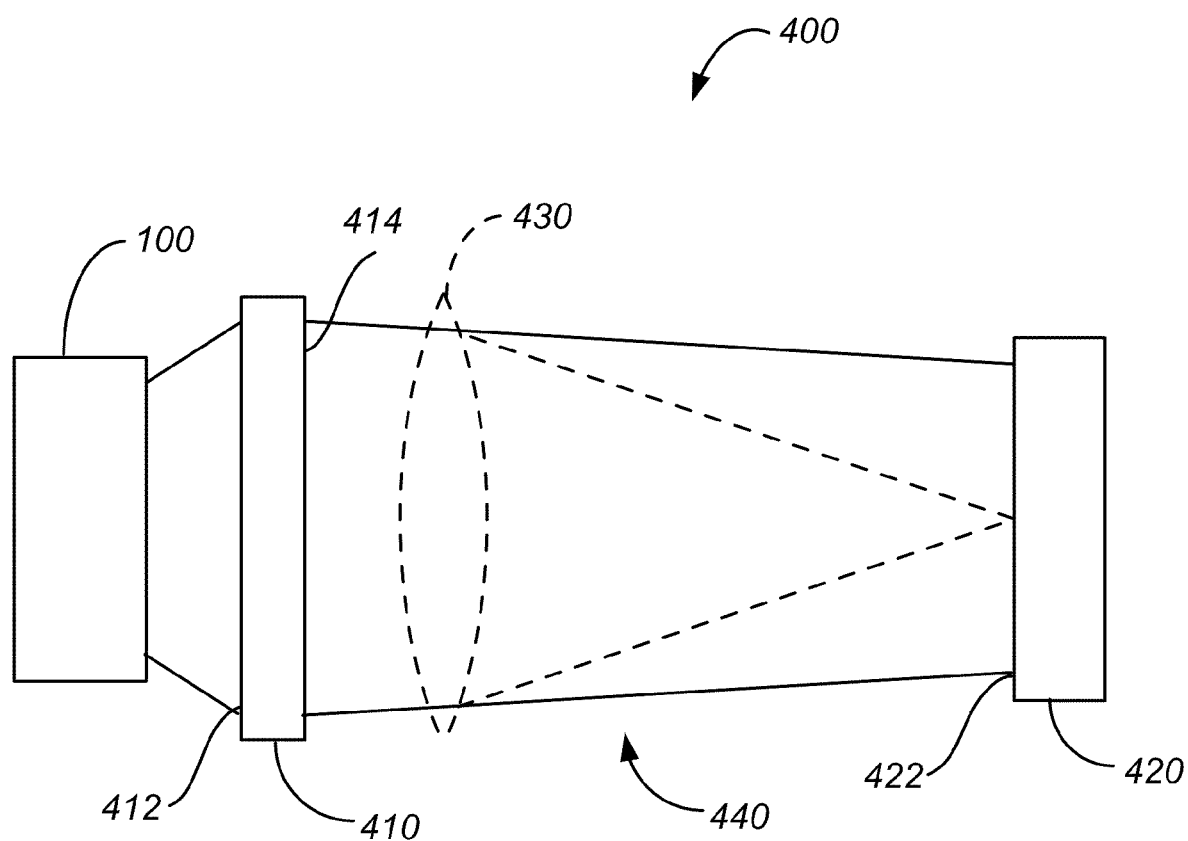
FIG. 4 is a simplified schematic diagram of a diode laser array homogenization system according to an embodiment of the present invention.

FIG. 4 is a simplified schematic diagram of a diode laser array homogenization system according to an embodiment of the present invention. The diode laser array homogenization system includes a laser diode array 100 and a diffractive homogenizer 410. The diffractive homogenizer 410 is also referred to as a diffractive optical element. In embodiments of the present invention, the diffractive homogenizer is fabricated using a slab of PTR glass (i.e., a rectangular parallelepiped of PTR glass). The surfaces 412 and 414 of the diffractive homogenizer are substantially planar and suitable for the deposition of antireflection (AR) coatings or other surface treatments. The diffractive homogenizer 410 is fabricated using a UV-based exposure and heat treatment process as described more fully throughout the present specification. The use of PTR glass, or other suitable transparent material that is able to provide a varying index of refraction as a function of position, enables the fabrication and use of a diffractive homogenizer with a continuous variation in refractive index as a function of position. Essentially, diffractive homogenizers vary the phase on a spatial scale which is small relative to the diode illumination non-uniformity. This is in contrast to conventional etched diffractive optical elements in which discontinuities in the surface features result in an index of refraction that changes discontinuously.

The phase variation needed for the diffractive homogenizer can be exactly calculated on a computer, thereby generating a spatial phase map of the intended optic. From this calculation, the required index variation needed to achieve the required phase variation is $\Delta n = \phi/t$, wherein $\Delta n$ is the change in the index of refraction, $\phi$ is the required phase, and t is the thickness of the PTR glass. The refractive index change produced in the PTR is typically proportional to the incident light intensity during exposure.

The diode laser array homogenization system 400 also includes a propagation path 440 between the diffractive homogenizer 410 and gain medium 420. The gain medium 420 can be an amplifier slab for high-power amplifier or an active component of laser. The design of the diffractive homogenizer 410 will be tailored to the intensity profile produced by the diode laser array 100. After propagating through the propagation path 440, the spatially dependent illumination produced by a diode laser array will be randomized, creating a homogenized beam for pumping of the amplifier slab or other suitable gain media. Depending on the desired diode pump fluence, an optional lens 430 may also be employed to concentrate the homogenized diode pump beam. The shape of the beam (measured in cross-section) can be varied using the diffractive homogenizer 410. As an example, a square or rectangular beam cross section from a two-dimensional diode laser array could be maintained at the gain medium 420 (e.g., an amplifier slab) or converted to a round beam at the gain medium 420.

The diffractive homogenizer 410 can perform homogenization of the beam as well as imaging. In typical diode laser pump array applications, a micro-lens array is utilized to collimate or partially collimate the light from the diode lasers. In the system 400 illustrated in FIG. 4, the diffractive homogenizer can include index of refraction variations effective to collimate the beam as well as remove the non-uniformities resulting from the geometry of the diode laser array. Thus, embodiments of the present invention do not require the use of a microlens array to collimate the light from the diode array.

PTR glass has been used to fabricate volume Bragg gratings for use in wavelength division multiplexing systems. These volume Bragg gratings are either periodic or chirped depending on the particular application and are fabricated by exposure using lasers as is typical with grating structures. Embodiments of the present invention contrast with these conventional grating structures formed in PTR since the pattern is not periodic or chirped, but defined based on the particular intensity profile present at the input face of the diffractive homogenizer and the desired intensity profile at the optical gain medium. Referring to FIG. 4, the index of refraction profile in the diffractive homogenizer is thus defined in terms of the intensity profile at surface 412 and the desired uniform intensity profile at surface 422. In contrast with a periodic grating structure, even a chirped grating structure, embodiments of the present invention utilize a non-sinusoidal index of refraction profile to achieve the desired diffraction effects.

Etched diffractive structures have a number of drawbacks that present problems for use in high power laser applications. The shape of the etched surface results in diffraction effects as a laser beam passes through the diffractive homogenizer. In order to control the surface feature, a high level of control is needed over the registration of one level of the etch mask to the other levels of the etch mask. Misalignment of the etch mask results in mis-defined surface shapes, thereby reducing the quality of the transmitted beam. Also, the etch depth control is a critical input into the final surface profile. For an 8-level etch process with the total height of the diffraction feature being about 1 μm, the final step height is 250 nm, which is difficult to etch with a high level of repeatability.

Assuming that adequate control is exercised over etch mask alignment and etch depth, the sharp features in etched diffraction structures result in scattering of incident light, adversely impacting the transfer efficiency of the diffractive homogenizer. Studies performed by the inventors utilizing etched diffractive structures have demonstrated transfer efficiencies (light out divided by light in) of about 60% after passage through an anamorphic telescope, the etched diffractive homogenizer, a focusing lens, and a mirror. Scattering losses from optical elements are typically reduced through the use of thin film AR coatings. However, the highly structured surface of etched diffraction structures adversely impacts the availability and quality of thin-film coatings. Thus, in some etched diffractive optical elements, Fresnel reflection losses at interfaces can make a significant contribution to reductions in power transfer efficiency.

Embodiments of the present invention reduce or eliminate the shortcomings of etched diffractive optical elements. The planar surfaces associated with diffractive homogenizers made using PTR glass are well-suited to high-power laser applications. Because the surfaces of the optic are flat, collection of dirt and dust, common with etched surfaces, is reduced. Additionally, the flat surfaces provide a substrate suitable for deposition of AR coatings, reducing Fresnel reflection losses at interfaces. The flat surfaces and "internal" index variations provided by the diffractive homogenizers described herein result in much higher transfer efficiencies than those associated with etched diffraction structures. In contrast with a 16-level binary plate tested by the inventor, which was characterized by a transfer efficiency of about 80%, embodiments of the present invention provide transfer efficiencies of >90%, >92%, >94%, >96%, or >98%.

Additionally, scattering losses in diffractive homogenizers fabricated in PTR glass are reduced in comparison with conventional etched diffraction elements. The continuous variation in index of refraction that results from the fabrication methods described herein eliminates discontinuities that are present in etched structures, thereby increasing the transfer efficiency of diffractive homogenizers fabricated in PTR glass.

As described above, conventional etched diffractive optics are limited in their transfer efficiency as a result of the etching process by which they are made. Utilizing embodiments of the present invention, it is possible to create a grayscale master slide utilizing techniques including those developed for semiconductor lithography and fabricate diffractive homogenizers in PTR glass that have continuous variations in refractive index. Printing and imaging techniques developed at significant cost for lithography can be leveraged such as image relay, step and repeat, and the like. The smooth phase profiles in these diffractive homogenizers will thus be much more efficient that conventional plates.

Embodiments of the present invention will be applicable to numerous high-power laser and amplifier applications. As an example, the LIFE program being developed at Lawrence Livermore National Laboratory, will utilize very large diode arrays and will benefit from the ability to deliver homogeneous light to the amplifiers. Homogenous illumination of the amplifiers will enable high beam quality and high efficiency. Additionally, large aperture lasers useful for defense applications could also benefit from homogenous pumping to increase beam quality, which also increases the laser intensity on target for tactical warfare. Other diode pumped solid state laser applications, such as laser machining, marking, drilling, and welding could also benefit from embodiments of the present invention by way of improved output energy and beam quality.

Figure 5A:
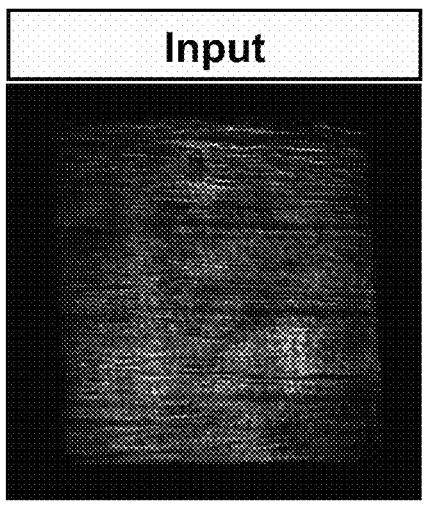
FIG. 5A is a simplified image of laser intensity as a function of position at an input of the diffractive homogenizer according to an embodiment of the present invention.

FIG. 5A is a simplified image of laser intensity as a function of position at an input of the diffractive homogenizer according to an embodiment of the present invention. As shown in FIG. 5A, the intensity of the laser varies greatly as a function of position. The intensity profile is characterized by varying power as a function of position with some regions of the beam much brighter than other regions. In fact, several portions of the laser beam appear almost black, indicating low amounts of power at these portions of the beam.

In this example, the light from the diode laser pump array has propagated a given distance and diffraction and propagation have resulted in the illustrated non-uniform intensity profile. If this intensity profile were imaged onto an amplifier slab, then the gain in the amplifier slab would be characterized by areas of high gain and areas of low gain, resulting in inefficient pumping of the gain medium in the amplifier. Moreover, the variation in the beam intensity will result in unpredictable gain profiles in the amplifier, adversely impacting system performance.

Figure 5B:
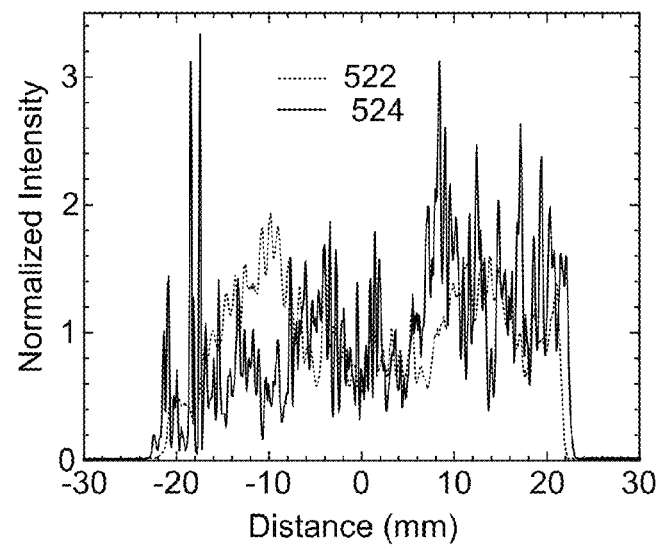
FIG. 5B includes simplified plots of laser intensity as a function of position at the input of the diffractive homogenizer according to an embodiment of the present invention.

FIG. 5B includes simplified plots of laser intensity as a function of position at the input of the diffractive homogenizer according to an embodiment of the present invention. An intensity profile taken along a horizontal direction is illustrated by dashed line 522 representing the width of the input beam and an intensity profile taken along a vertical direction is illustrated by solid line 524 representing the height of the input beam. As illustrated in FIG. 5A, the measurement along the width (dashed line 522) is characterized by an approximately bimodal distribution with peaks at the edge regions and a decrease in intensity at the middle of the profile. The measurement along the height (solid line 524) is characterized by the majority of power in the upper portion of the beam, with low intensity in the central in lower regions. A spike at the lower edge of the beam is visible in the laser intensity plot.

The intensity variation across the laser beam is large, with some of the intensity spikes being more than three times larger than other intensity values. Referring to solid line 524 associated with a vertical measurement through the beam, the spikes at about −20 mm have a normalized intensity value greater than three, whereas the intensity at about −10 mm is less than one. For dashed line 522, which has an average normalized intensity value of around one, some peaks reach about twice that value, with troughs down to about half that value. Thus, variations in the intensity can be greater than 100%. As discussed in relation to FIG. 5A, a laser beam with the intensity profile as illustrated in FIG. 5B will result in poor performance when used as a pump beam or for other high-power applications. Focusing of the input beam illustrated in FIGS. 5A and 5B will result in a non-diffraction limited spot, with significant amounts of power in higher-order lobes. Thus, the power on target will be far less than available had the input beam been uniform.

Figure 5C:
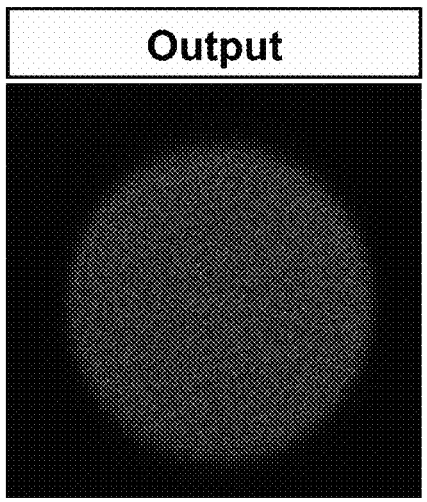
FIG. 5C is a simplified image of laser intensity as a function of position at an output of the diffractive homogenizer according to an embodiment of the present invention.

FIG. 5C is a simplified image of laser intensity as a function of position at an output of the diffractive homogenizer according to an embodiment of the present invention. In referring to the laser beam intensity at the output of the diffractive homogenizer, this does not require the output beam to be positioned at a surface of the diffractive homogenizer, but can be understood as the beam at an output position spaced apart from the diffractive homogenizer. Referring to FIG. 4, the output beam may be positioned at a surface 422 of the gain medium 420. The laser beam has been converted from a generally rectangular beam shape into a circular beam. Conversion of the beam shape is not required by embodiments of the present invention, but can be provided as illustrated in this figure. As illustrated in FIG. 5C, the image of laser beam intensity shows a uniform intensity pattern as a function of position, which is desirable for many applications.

Figure 5D:
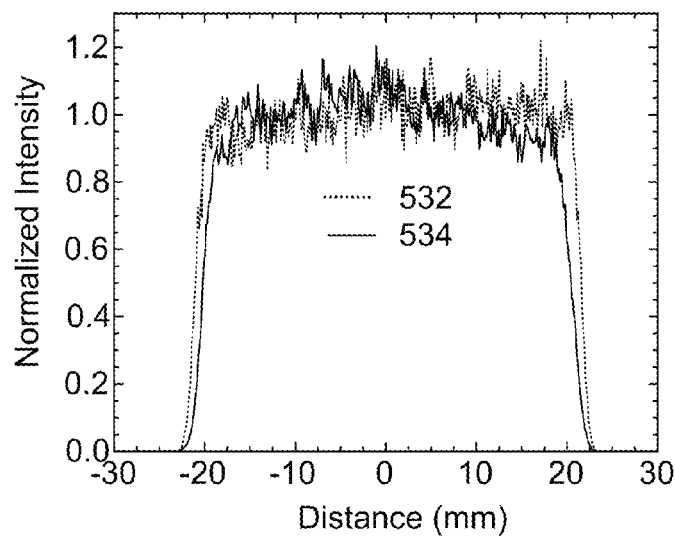
FIG. 5D includes simplified plots of laser intensity as a function of position at the output of the diffractive homogenizer according to an embodiment of the present invention.

FIG. 5D includes simplified plots of laser intensity as a function of position at the output of the diffractive homogenizer according to an embodiment of the present invention. The laser intensity as a function of position across the circular beam is illustrated by dashed line 532 and solid line 534. The intensity profile taken along the horizontal direction is illustrated by dashed line 532 and the intensity profile taken along the vertical direction is illustrated by solid line 534. In comparison with FIG. 5B, the intensity profiles in both the horizontal and vertical directions are substantially uniform, with only minor variations as a function of position. Utilizing the diffractive homogenizer described herein provides an intensity variation of less than 20% across the beam, less than 15%, less than 10%, less than 5%, less than 4%, less than 3%, less than 2%, or less than 1%, depending on the particular design criteria for the diffractive homogenizer.

Figure 6:
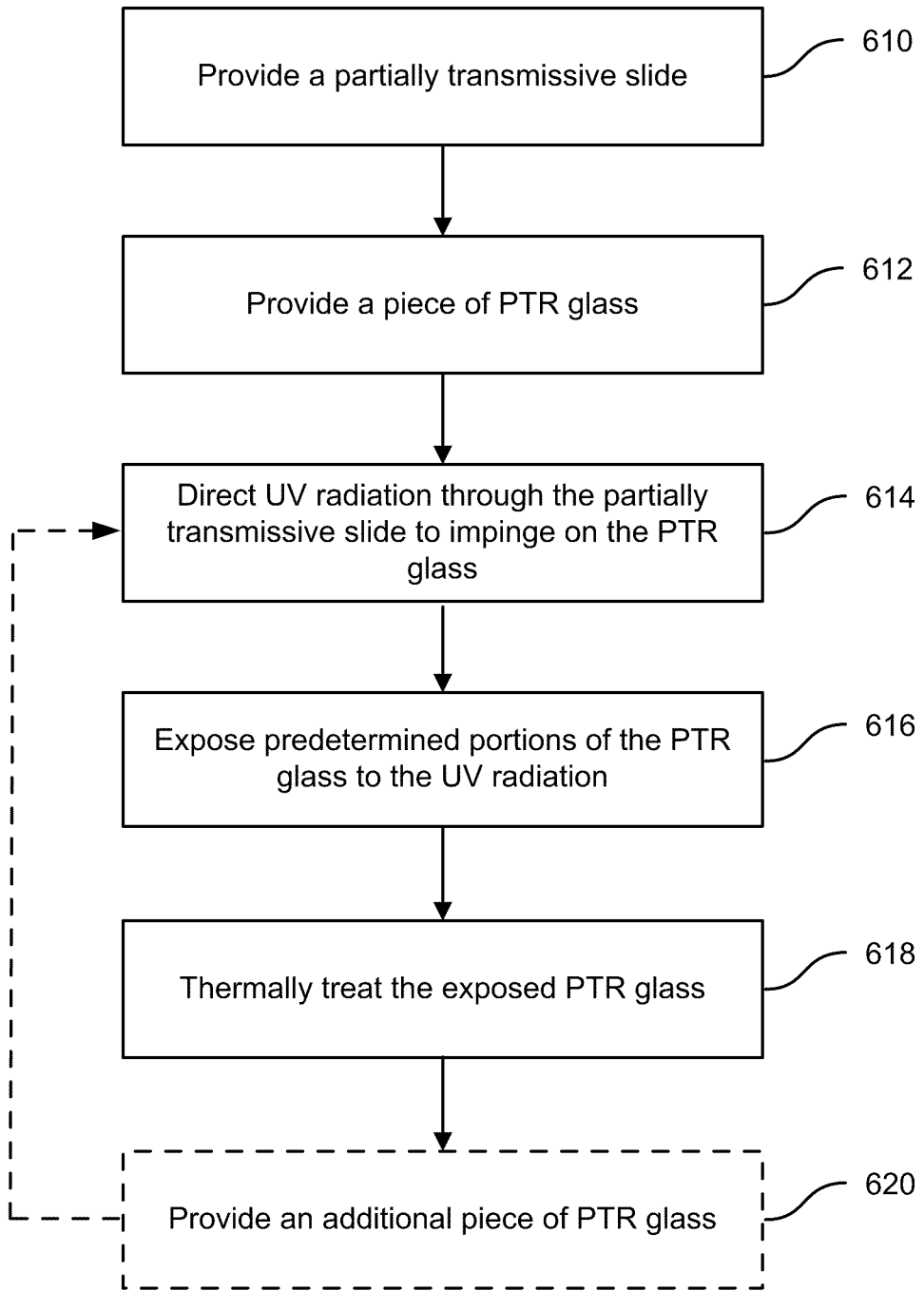
FIG. 6 is a simplified flowchart illustrating a method of fabricating a diffractive homogenizer according to an embodiment of the present invention.

According to embodiments of the present invention, diffractive homogenizers are manufactured by using a master plate having either an intensity or phase variation and imaging a predetermined intensity profile on a photorefractive glass substrate, thereby creating a new diffractive homogenizer with a single exposure. FIG. 6 is a simplified flowchart illustrating a method of fabricating a diffractive homogenizer according to an embodiment of the present invention. In the method illustrated in FIG. 6, one or more diffractive homogenizers can be fabricated for use in homogenization of light from a diode laser pump array. The method includes providing a partially transmissive slide (610) and a piece of PTR glass (612). The partially transmissive slide may be a photographic image suitable for use in grayscale photolithographic techniques. Using such a photographic image, shades of gray can be utilized to produce continuous index of refraction changes as a function of position in the PTR glass. Based on computations of the desired index of refraction as a function of position in the PTR glass, the density of the partially transmissive slide, and the intensity of the illumination of the PTR glass as a result, will vary according to the amount of light to be exposed on the various portions of the PTR glass.

The method also includes directing UV radiation through the partially transmissive slide to impinge on the PTR glass (614). The intensity pattern is a predetermined pattern as appropriate to the desired index of refraction pattern in the PTR glass. Predetermined portions of the PTR glass are exposed to UV radiation (616) and the exposed PTR glass is thermally treated to produce the desired index of refraction profile as a function of position. Some embodiments of the present invention provide a continuous variation in index of refraction as a function of position. The smoothly varying phase profile provided by these diffractive homogenizers enables higher transfer efficiency in generating the desired uniform beam profile.

Another method that can be used to create the desired intensity profile on the PTR glass is to use a spatial light modulator to block portions of the UV beam and to create a continuously varying intensity pattern on the PTR glass. Image relay techniques utilized as a part of photolithographic processes can be utilized to magnify or demagnify images produced by either use of a partially transmissive slide or use of a spatial light modulator. As an example, for large aperture optics suitable for use in the LIFE program, the methods described herein can be scaled using a stepper to properly register one exposure site to the next, thereby timing together a complete large area diffractive homogenizer. As described more fully in relation to FIG. 7, a large area master plate fabricated using a tiling process can then be used to create duplicate plates utilizing a single exposure.

Diffractive homogenizers fabricated in PTR glass are also more robust than conventional etched diffraction structures. The flat surfaces of the diffractive homogenizers provided according to embodiments of the present invention are much more difficult to damage than etched structures with fine features.

As an optional method, an additional piece of PTR glass can be provided (620). Using the same partially transmissive slide, UV radiation can be directed through the partially transmissive slide to impinge on the additional piece of PTR glass. Portions of the additional piece of PTR glass will be exposed to the UV radiation and the exposed PTR glass will then be thermally treated to provide a second diffractive homogenizer. This optional path can be performed multiple times. Utilizing this optional process, multiple diffractive homogenizers can be fabricated using a single partially transmissive slide as a master slide. For large area optics, the partially transmissive slide can be fabricated using a step and repeat process based on smaller sections of partially transmissive media. Thus, the disclosed methods of fabricating diffractive homogenizers, including spatial beam homogenizers for diode laser arrays and laser beams, enables low-cost mass production at a scale limited only by the size of the substrate (e.g., PTR glass substrate).

It should be appreciated that the specific steps illustrated in FIG. 6 provide a particular method of fabricating a diffractive homogenizer according to an embodiment of the present invention. Other sequences of steps may also be performed according to alternative embodiments. For example, alternative embodiments of the present invention may perform the steps outlined above in a different order. Moreover, the individual steps illustrated in FIG. 6 may include multiple substeps that may be performed in various sequences as appropriate to the individual step. Furthermore, additional steps may be added or removed depending on the particular applications. One of ordinary skill in the art would recognize many variations, modifications, and alternatives.

Figure 7:
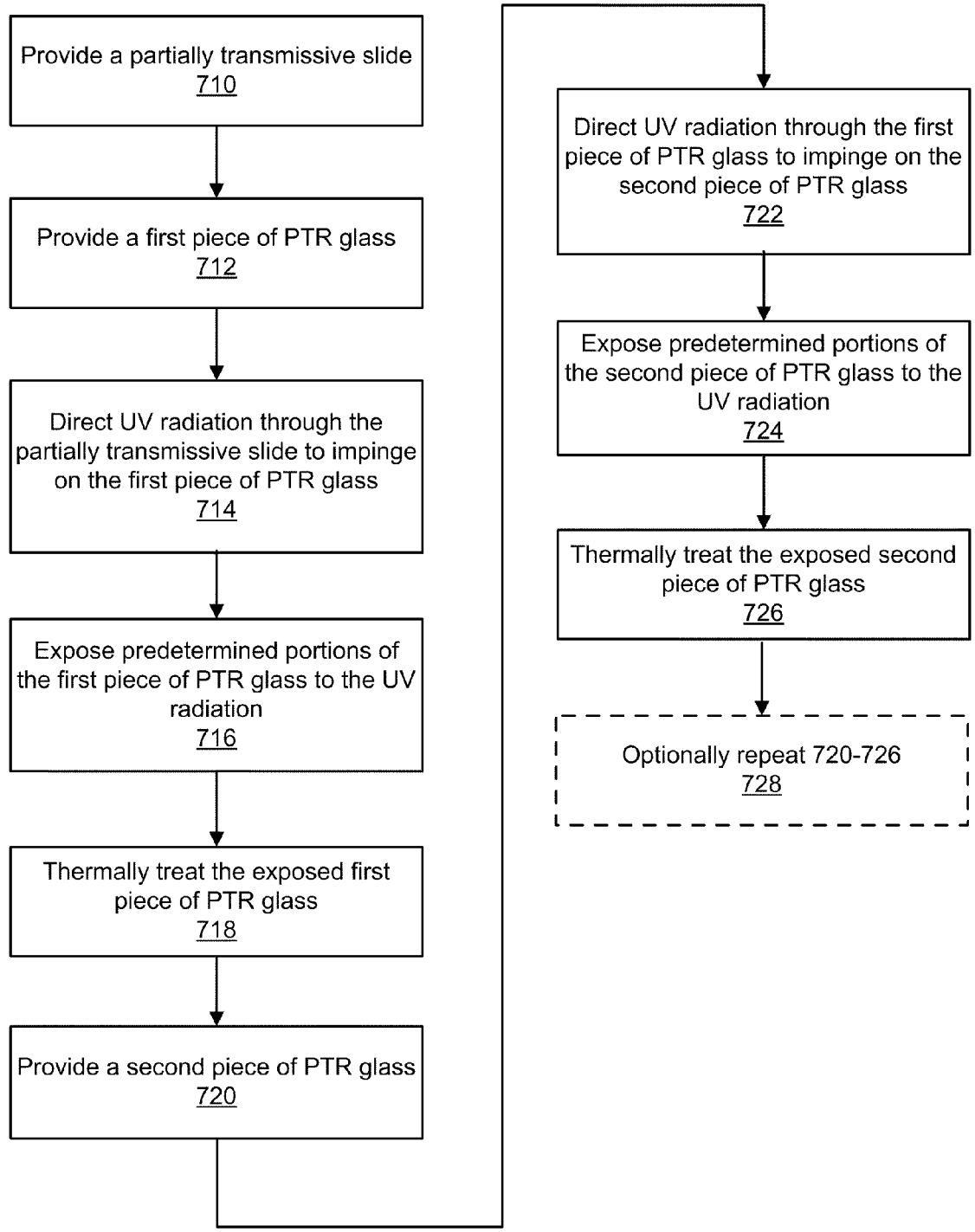
FIG. 7 is a simplified flowchart illustrating a method of fabricating diffractive homogenizers according to another embodiment of the present invention.

FIG. 7 is a simplified flowchart illustrating a method of fabricating diffractive homogenizers according to another embodiment of the present invention. The method includes providing a partially transmissive slide (710) and a first piece of PTR glass (712). As described below, the first piece of PTR glass will be processed and then used as a master plate in producing additional pieces of PTR glass for use as diffractive homogenizers. The method also includes directing UV radiation through the partially transmissive slide to impinge on the first piece of PTR glass (714) and exposing predetermined portions of the first piece of PTR glass to the UV radiation (716).

In order to create the desired intensity pattern on the first piece of PTR glass, methods other than use of a partially transmissive slide may be utilized. For example, a two-dimensional spatial light modulator may be utilized to create a desired intensity pattern on the first piece of PTR glass thereby exposing predetermined portions of the first piece of PTR glass to UV radiation.

After the PTR glass is exposed, it is thermally treated to produce a predetermined index of refraction pattern as a function of position inside PTR glass (718). The first piece of PTR glass is provided with index of refraction pattern that, through diffraction, will produce a predetermined intensity profile at a specified imaging plane. Thus, a computation is included in embodiments of the method in order to produce an intensity pattern on the first piece of PTR glass that will result in an index of refraction pattern that will subsequently be used to produce a second intensity pattern as described more fully below.

Embodiments of the present invention can utilize several different methods to create the master plate. In order to generate the desired light intensity profile for the master plate, spatial light modulators, lithographic printing techniques, standard photolithographic etching techniques, magnetorheological finishing techniques, or the like can be used. After the master plate is fabricated, providing a phase plate with predetermined phase variation as a function of position across the plate, the master plate is used as a master for generating a nearly infinite number of duplicate plates, with the cost of the duplicate plate approaching that of the substrate used for the duplicate plate.

The method further includes providing a second piece of PTR glass (720) and directing UV radiation through the first piece of PTR glass to impinge on the second piece of PTR glass (722). The first piece of PTR glass is thus used as a master plate in a manner analogous to the use of the partially transmissive slide. It will be appreciated that the partially transmissive slide is used to create a predetermined intensity pattern on the first piece of PTR glass. In this embodiment of the present invention, the first piece of PTR glass is now used to create a second predetermined intensity pattern on the second piece of PTR glass. Diffraction of the UV radiation passing through the first piece of PTR glass is utilized to form the second predetermined intensity pattern. Additional optical elements may be utilized as part of the optical system in order to form the second predetermined intensity pattern. One of ordinary skill in the art would recognize many variations, modifications, and alternatives.

Predetermined portions of the second piece of PTR glass are exposed to the UV radiation passing through the first piece of PTR glass (724) and the second piece of PTR glass is thermally treated after exposure (726). Thus, the second piece of PTR glass includes an index of refraction profile as a function of position that is suitable for use as a diffractive optical element, for example, a diffractive homogenizer. In order to utilize the first piece of PTR glass as a master plate, processes 720-726 are optionally repeated with additional pieces of PTR glass to form additional diffractive homogenizers. Thus, after fabrication of the initial master plate, multiple copies of the second piece of PTR glass can be fabricated easily and inexpensively in comparison with conventional techniques. As discussed in relation to FIG. 6, photolithographic techniques including image relay, magnification, demagnification, and the like, can be utilized during exposure of the PTR glass to UV radiation.

It should be appreciated that the specific steps illustrated in FIG. 7 provide a particular method of fabricating diffractive homogenizers according to an embodiment of the present invention. Other sequences of steps may also be performed according to alternative embodiments. For example, alternative embodiments of the present invention may perform the steps outlined above in a different order. Moreover, the individual steps illustrated in FIG. 7 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 8:
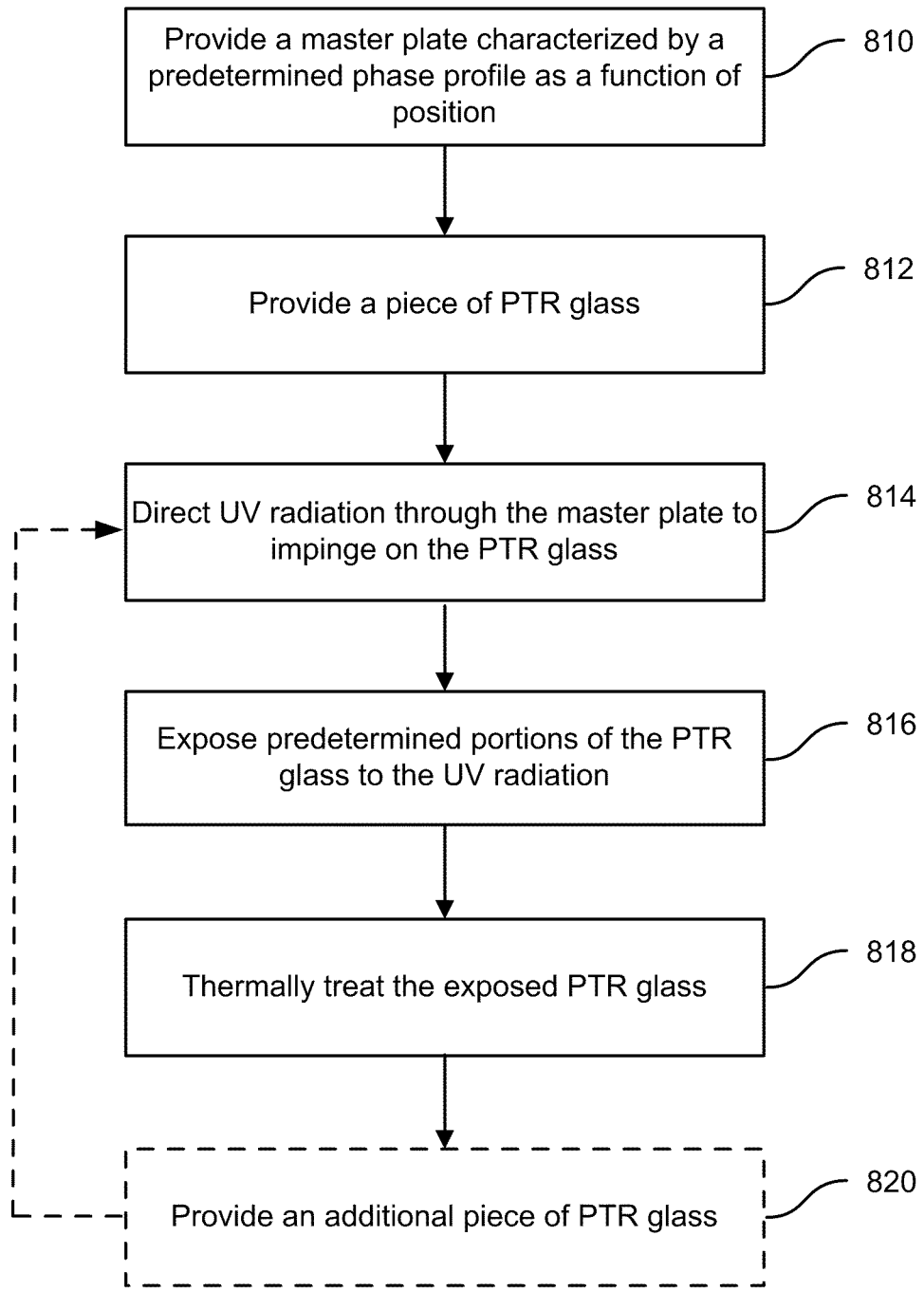
FIG. 8 is a simplified flowchart illustrating a method of fabricating diffractive homogenizers using a master plate according to an embodiment of the present invention.

FIG. 8 is a simplified flowchart illustrating a method of fabricating diffractive homogenizers using a master plate according to an embodiment of the present invention. The method includes providing a master plate characterized by a predetermined phase profile as a function of position (810). The master plate can be fabricated using PTR materials or may be a conventional multi-level etched diffractive element. The method also includes providing a piece of PTR glass (812) and directing UV radiation through the master slide to impinge on the PTR glass (814). The phase profile of the master plate is a predetermined phase profile that will cause light transmitted through the master plate to diffract and provide an intensity pattern at the piece of PTR glass.

The method further includes exposing predetermined portions of the PTR glass to the UV radiation (816) and thermally treating the exposed PTR glass (818) to form a diffractive homogenizer. The methods illustrated in FIG. 8 share common features with those illustrated in FIGS. 6 and 7 and description associated with those figures is applicable to FIG. 8.

In order to fabricate additional diffractive homogenizers, additional pieces of PTR glass are provided (820) and processes 814 through 818 are repeated to fabricate the additional diffractive homogenizers. Utilizing a single phase-based master plate, a plurality of identical diffractive homogenizers, with the cost of the diffractive homogenizers approaching that of the substrate used during fabrication. Although the method illustrated in FIG. 8 utilizes a single exposure of the master plate during fabrication of the diffractive homogenizer, step and repeat methodologies may be utilized to fabricate diffractive homogenizers larger than the master plate.

It should be appreciated that the specific steps illustrated in FIG. 8 provide a particular method of fabricating diffractive homogenizers using a master plate according to an embodiment of the present invention. Other sequences of steps may also be performed according to alternative embodiments. For example, alternative embodiments of the present invention may perform the steps outlined above in a different order. Moreover, the individual steps illustrated in FIG. 8 may include multiple sub-steps that may be performed in various sequences as appropriate to the individual step. Furthermore, additional steps may be added or removed depending on the particular applications. One of ordinary skill in the art would recognize many variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. An optical amplifier system comprising:
a diode pump array including a plurality of semiconductor diode laser bars disposed in an array configuration and characterized by a periodic distance between adjacent semiconductor diode laser bars, the periodic distance being measured in a first direction perpendicular to each of the plurality of semiconductor diode laser bars, wherein the diode pump array provides a pump output propagating along an optical path and characterized by a first intensity profile measured as a function of the first direction and having a variation greater than 10%;
a diffractive optic disposed along the optical path, wherein the diffractive optic comprises a photo-thermo-refractive glass member; and
an amplifier slab having an input face and position along the optical path and separated from the diffractive optic by a predetermined distance, wherein a second intensity profile measured at the input face of the amplifier slab as a function of the first direction has a variation less than 10%.

2. The optical amplifier system of claim 1 wherein the photo-thermo-refractive glass member comprises a continuous variation in the index of refraction.

3. The optical amplifier system of claim 1 wherein the photo-thermo-refractive glass member is substantially free of sinusoidal grating structures.

4. The optical amplifier system of claim 1 wherein the diffractive optic includes grating structures having a pattern that is defined based on an intensity profile present at an input face of the diffractive optic and a desired intensity profile at the amplifier slab.

5. The optical amplifier system of claim 1 further comprising one or more lenses disposed along the optical path between the diffractive optic and the amplifier slab.

6. The optical amplifier system of claim 1 wherein the photo-thermo-refractive glass member has a first planar surface opposing a second planar surface.

7. The optical amplifier system of claim 1 wherein the first intensity profile has a variation between 10% and 300%.

8. The optical amplifier system of claim 7 wherein the first intensity profile has a variation between 10% and 100%.

9. The optical amplifier system of claim 8 wherein the first intensity profile has a variation between 10% and 50%.

10. The optical amplifier system of claim 1 wherein the second intensity profile has a variation between 1% and 10%.

11. The optical amplifier system of claim 10 wherein the second intensity profile has a variation between 2% and 5%.

12. The optical amplifier system of claim 1 wherein the diffractive optic comprises grating structures having a pattern that is neither periodic nor chirped.

* * * * *